(12) United States Patent
Reimer et al.

(10) Patent No.: US 9,842,762 B1
(45) Date of Patent: Dec. 12, 2017

(54) METHOD OF MANUFACTURING A SEMICONDUCTOR WAFER HAVING AN SOI CONFIGURATION

(71) Applicant: GLOBALFOUNDRIES Inc., Grand Cayman (KY)

(72) Inventors: Berthold Reimer, Dresden (DE); Boris Bayha, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/349,306

(22) Filed: Nov. 11, 2016

(51) Int. Cl.
| | |
|---|---|
| *H01L 27/108* | (2006.01) |
| *H01L 21/3105* | (2006.01) |
| *H01L 21/02* | (2006.01) |
| *H01L 21/44* | (2006.01) |
| *H01L 21/302* | (2006.01) |
| *H01L 21/311* | (2006.01) |
| *H01L 21/762* | (2006.01) |
| *H01L 21/263* | (2006.01) |
| *H01L 21/66* | (2006.01) |

(52) U.S. Cl.
CPC .... *H01L 21/7624* (2013.01); *H01L 21/02236* (2013.01); *H01L 21/2633* (2013.01); *H01L 21/31053* (2013.01); *H01L 21/31116* (2013.01); *H01L 22/26* (2013.01); *H01L 21/02255* (2013.01)

(58) Field of Classification Search
CPC ............. H01L 21/28273; H01L 27/115; H01L 27/11521; H01L 29/42324; H01L 29/42336; H01L 29/66825; H01L 29/7881
USPC .......................... 257/315, 316; 438/697, 770
See application file for complete search history.

(56) References Cited

U.S. PATENT DOCUMENTS

| | | | |
|---|---|---|---|
| 5,385,633 A | 1/1995 | Russell et al. | |
| 5,953,578 A | 9/1999 | Lee | |
| 2004/0070018 A1* | 4/2004 | Keeth | H01L 27/105 257/300 |
| 2004/0180545 A1* | 9/2004 | Lohokare | H01L 21/32115 438/691 |
| 2006/0068557 A1* | 3/2006 | Ochimizu | H01L 21/76281 438/312 |
| 2007/0164379 A1* | 7/2007 | Brown | B81C 1/00666 257/417 |
| 2011/0033958 A1* | 2/2011 | Ohtsuki | H01L 21/02238 438/16 |

* cited by examiner

*Primary Examiner* — Kimberly Rizkallah
*Assistant Examiner* — Brian Turner
(74) *Attorney, Agent, or Firm* — Amerson Law Firm, PLLC

(57) ABSTRACT

The present disclosure provides a method of manufacturing a semiconductor wafer having a semiconductor-on-insulator (SOI) configuration, the method including providing a semiconductor starting wafer, the semiconductor starting wafer having a base substrate, a semiconductor layer formed over the base substrate and a buried insulating material layer formed between the semiconductor substrate and the base substrate, exposing the semiconductor starting wafer to a first oxidization process, wherein an oxide surface region is formed by oxidizing an upper surface region of the semiconductor layer, thinning the oxide surface region, exposing the semiconductor starting wafer to a second oxidization process, wherein a thickness of the oxide surface region is locally increased, and removing the oxide surface region, wherein the semiconductor layer is exposed.

20 Claims, 6 Drawing Sheets

METHOD OF MANUFACTURING A SEMICONDUCTOR WAFER HAVING AN SOI CONFIGURATION

BACKGROUND

1. Field of the Disclosure

The present disclosure relates to methods of manufacturing a semiconductor wafer having a semiconductor-on-insulator (SOI) configuration and, more particularly, to preparing SOI semiconductor starting wafers at the beginning of front-end-of-line (FEOL) processing in very-large-scale-integration (VLSI).

2. Description of the Related Art

In the ongoing task to comply with constraints imposed by Moore's Law, FDSOI ("fully depleted silicon-on-insulator") seems to be a promising candidate for next generation technologies in the fabrication of semiconductor devices at technology nodes of 22 nm and beyond. Currently, FDSOI is considered as a promising candidate for solving, with comparatively less process complexity, scaling, leakage and variability issues to further shrink CMOS technology beyond 28 nm and, particularly, beyond 22 nm.

In detail, FDSOI is considered as offering the following benefits: the electrostatic control of transistor devices in FDSOI technology acts as a performance booster and enables lower VDD; random dopant fluctuation is reduced in FDSOI technology, therefore decreasing the variability of the threshold voltage of transistor devices; and transistor devices fabricated in accordance with FDSOI technology show low leakage and a good control of short channel effects when compared to conventional bulk technology.

The range of FDSOI technology covers a wide range of applications from high performance, lower power systems on chip to ultralow power applications. This range covers a great variety of markets, such as mobile internet devices (Smartphones, tablets, notebooks, etc.), imaging (digital cameras, camcorders, etc.), mobile multimedia, home multimedia (TV, Blueray, etc.), automotive infotainment and so on.

Aside from FDSOI allowing the combination of high performance and low power consumption, complemented by an excellent responsiveness to power management design techniques, fabrication processes as employed in FDSOI techniques are comparatively simple and actually represent a low risk evolution of conventional planar bulk CMOS techniques when compared to multidimensional semiconductor devices, such as FinFETs.

In SOI techniques, a special kind of substrate is used, the substrate being formed by a semiconductor layer, such as a top silicon layer or a layer of germanium or silicon germanium, formed on a buried oxide (BOX) layer, which is in turn formed on a semiconductor substrate. For example, in case of an N-type SOI device, a P-type semiconductor film is sandwiched between a gate stack and the BOX layer.

Furthermore, in SOI techniques, one distinguishes between two types of SOI devices: PDSOI (partially depleted SOI) and FDSOI devices. Both types differ in that the thickness of the semiconductor layer in FDSOI is sufficiently small such that it is fully depleted, while the semiconductor layer in PDSOI is of greater thickness relative to FDSOI such that the semiconductor layer in PDSOI is not fully depleted. Typically, the thickness of the top silicon layer in known starting wafers for FDSOI technology processes is typically in a range from about 10-25 nm and according starting wafers enable the fabrication of planar fully depleted transistors with less than 10 nm of silicon under the gate.

Current requirements on the uniformity of the thickness of the top silicon layer are set to lie within a few angstroms in order to comply with demands on reliability and performance in manufactured integrated circuits. According to a current requirement, the 6 sigma range is required to be less than 0.1 nm, wherein sigma (also represented by the Greek letter sigma $\sigma$ or the Latin letter s) denotes the standard deviation which is a term in statistics and represents a measure that is used to quantify the amount of variation or dispersion of a set of data values. For example, a low standard deviation indicates that data points tend to be close to the mean (also called the expected value) of the set, while a high standard deviation indicates that data points are spread out over a wider range of values. Generally, the standard deviation of a random variable, statistical population, data set, or probability distribution is the square root of its variance. A useful property of the standard deviation is that, unlike the variance, it is expressed in the same units as the data. The term "six sigma range" therefore denotes the range within six standard deviations from the mean and current requirements in VLSI FDSOI set an upper bound such that deviations from the mean within the range of six standard deviations from the mean are less than 0.1 nm. As, according to Chebyshev's inequality, more than 97% of measured data are to lie within the range of six standard deviations, it may be understood that current requirements demand uniformity of the thickness of the top silicon layer to a very high degree because the deviation from the mean is basically allowed to be less than 0.1 nm.

Starting from a provided SOI starting wafer, an FDSOI wafer may be prepared by oxidizing the top silicon layer, typically having a thickness at about 12 nm, and removing the oxide such that a top silicon layer of reduced thickness, typically in the range from about 5-30 nm, is obtained.

With regard to FIGS. 1a and 1b, measurements of the thickness of the top silicon layer in FDSOI starting wafers were taken.

FIG. 1a shows thickness values taken across a starting wafer by measurement and/or statistical evaluation prior to a reduction of the thickness of the silicon layer of starting wafers, that is, the starting wafer is not an FDSOI starting wafer but an SOI starting wafer where the top silicon layer has a thickness of about 120 angstroms. As illustrated in FIG. 1a, the thickness profile taken across the starting wafer shows a strongly varying thickness at 120 angstroms in a range of about ±5 angstroms around the mean.

Regarding FIG. 1b, thickness values taken across the starting wafer are shown after a first process of oxidizing an upper surface region of the top silicon layer and prior to a removal of the oxide in attempts to reduce the thickness of the top silicon layer to thickness values of the top silicon layer. As shown herein, the thickness profile shows strong variability around a mean of 80 angstroms thickness in the range of about ±3 angstroms around the mean.

With regard to FIGS. 1c and 1d, a variability of a thickness across measured starting wafers is illustrated by means of schematic contour plots in top views on wafer surfaces.

FIG. 1c schematically shows a contour line plot indicating a thickness profile of the top silicon layer of a first measured starting wafer 10a within a measuring area 11a on the basis of measurement points 12a (the depicted amount of measurement points is only for illustrative purposes), the contour lines indicating lines of constant thickness.

Similarly, FIG. 1d shows a contour line plot of another measured starting wafer 10b measured within a measuring area 11b on the basis of measuring points 12b (the depicted amount of measurement points is only for illustrative purposes), the contour lines indicating lines of constant thickness.

The measured starting wafers 10a and 10b show a non-uniformity in the thickness profile around a mean thickness of 12 nm in the range of about ±0.3 nm.

In view of the above discussion, there is a need in the art to provide a method of processing a semiconductor starting wafer to provide a processed starting wafer complying with required uniformity constraints of a few angstroms, e.g., currently a 6 sigma range of less than about 0.1 nm.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In accordance with a first aspect of the present invention, a method of manufacturing a semiconductor wafer having a semiconductor-on-insulator (SOI) configuration is provided. In accordance with illustrative embodiments herein, the method includes providing a semiconductor starting wafer, the semiconductor starting wafer having a base substrate, a semiconductor layer formed over the base substrate, and a buried insulating material layer formed between the semiconductor substrate and the base substrate, exposing the semiconductor starting wafer to a first oxidization process, wherein an oxide surface region is formed by oxidizing an upper surface region of the semiconductor layer, thinning the oxide surface region, exposing the semiconductor starting wafer to a second oxidization process, wherein a thickness of the oxide surface region is locally increased, and removing the oxide surface region, wherein the semiconductor layer is exposed.

In accordance with a second aspect of the present invention, a method of manufacturing a semiconductor wafer having a semiconductor-on-insulator (SOI) configuration is provided. In accordance with some illustrative embodiments herein, the method includes providing a semiconductor starting wafer, the semiconductor starting wafer having a base substrate, a semiconductor layer formed over the base substrate, and a buried insulating material layer formed between the semiconductor layer and the base substrate, exposing the semiconductor starting wafer to a first oxidization process, wherein an oxide surface region is formed by oxidizing an upper surface region of the semiconductor layer, determining a thickness profile of each of the semiconductor layer and the oxide surface region, determining a target thickness of the semiconductor layer, thinning the oxide surface region in a dry etching process, exposing the semiconductor starting wafer to a second oxidization process, wherein a thickness of the oxide surface region is locally increased, and removing the oxide surface region in a wet etching process, wherein the semiconductor layer having the target thickness is exposed.

BRIEF DESCRIPTION OF THE DRAWINGS

The disclosure may be understood by reference to the following description taken in conjunction with the accompanying drawings, in which like reference numerals identify like elements, and in which.

Figure 1A:
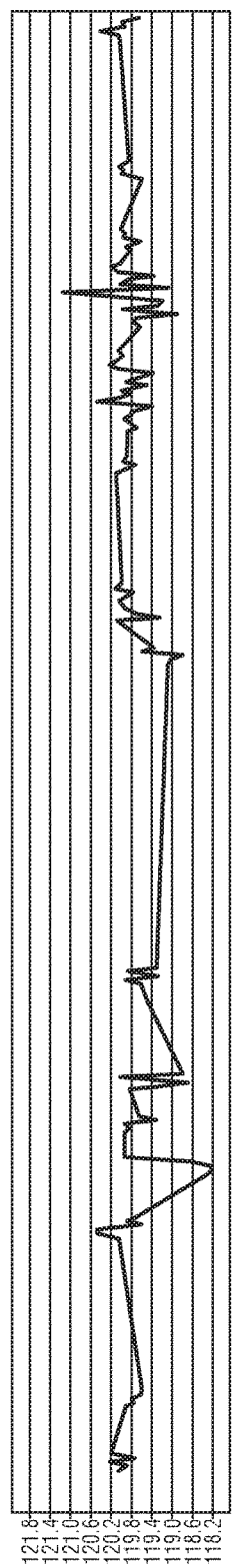
FIGS. 1a-1b schematically illustrate thickness profiles of conventional prior art starting wafers.
Figure 1B:
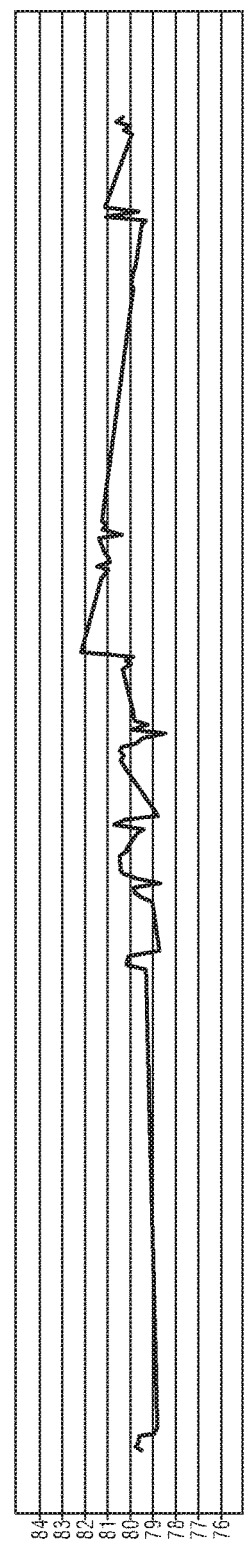
Figure 1C:
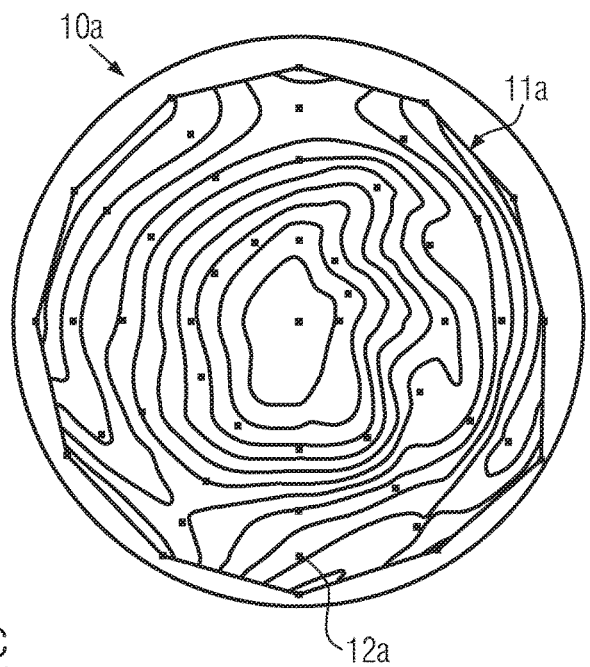
FIGS. 1c-1d schematically illustrate contour line plots of conventional prior art starting wafers.
Figure 1D:
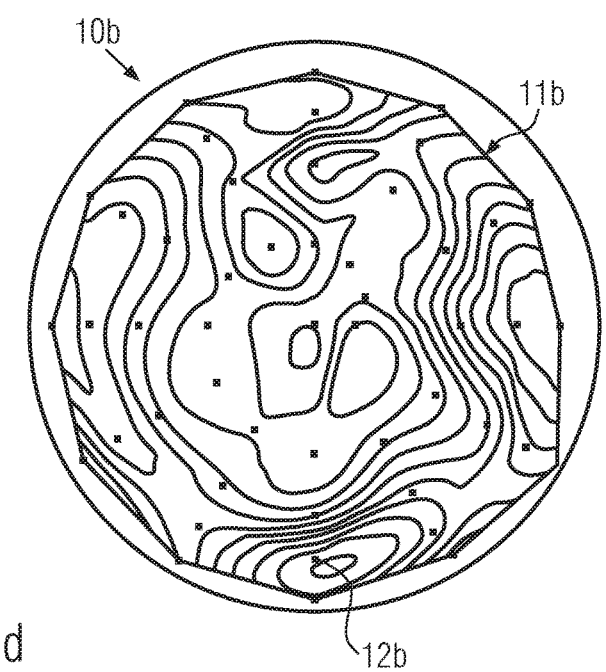

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In general, a wafer, also called a slice or substrate, is a thin slice of semiconductor material, such as a crystalline silicon, used in electronics for the fabrication of integrated circuits, for example. The wafer serves as the substrate for microelectronic devices built in and over the wafer and undergoes many microfabrication process steps, such as doping or ion implantation, etching, deposition of various materials, and photolithographic patterning, after which the individual microcircuits are separated (dicing) and packaged in the end.

In wafer fabrication, a procedure composed of many repeated sequential processes to produce complete electrical or photonic circuits is performed. Examples of such processes may include, without limitation, production of radio frequency (RF) amplifiers, LEDs, optical computer components and CPUs for computers. Wafer fabrication is used to build components with the necessary electrical structures.

The main process may begin with electrical engineers designing the circuit and defining its functions, and specifying the signals, inputs, outputs and voltages needed. These electrical circuit specifications are entered into electrical circuit design software, such as SPICE, and then imported into circuit layout programs, which are similar to ones used for computer aided design. This is necessary for the layers to be defined for photomask production. The resolution of the circuits increases rapidly with each step in design, as the scale of the circuits at the start of the design process is already being measured in fractions of micrometers. Each step thus increases circuit density for a given area.

Generally, wafers start out as blank and pure starting wafers, on which circuits are built in layers in clean rooms. Processes used for building circuits on wafers comprise a vast plurality of different steps of great complexity which are often repeated many hundreds of times, depending on the desired circuit and its connections.

New processes to accomplish each of these steps with better resolution and in improved ways emerge every year, with the result of constantly changing technology in the wafer fabrication industry. New technologies result in denser packing of minuscule surface features such as transistors and micro-electro-mechanical systems (MEMS). This increased density continues the trend often cited as Moore's Law.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In various aspects of the present disclosure, a semiconductor starting wafer is prepared prior to any front-end-of-line (FEOL) processing employed for forming semiconductor device structures in and on the semiconductor starting wafer. The prepared semiconductor starting wafer may be prepared such that semiconductor device structures may be subsequently fabricated by using advanced technologies, i.e., technologies applied to approach technology nodes smaller than 100 nm, for example, smaller than 50 nm or smaller than 35 nm, e.g., at 22 nm or below. The person skilled in the art will appreciate that, according to the present disclosure, ground rules smaller or equal to 45 nm, e.g., at 22 nm or below, may be imposed. The person skilled in the art will appreciate that the prepared semiconductor starting wafer may be employed in the fabrication of semiconductor device structures having a minimal length dimension and/or width dimension smaller than 100 nm, for example, smaller than 50 nm or smaller than 35 nm or smaller than 22 nm. For example, the prepared semiconductor starting wafer may be employed in 45 nm technologies or below, e.g., 22 nm or even below.

In accordance with the present disclosure, FDSOI substrates have a thin semiconductor layer disposed on a buried insulating material layer, which in turn is formed on a base substrate. In accordance with some illustrative embodiments herein, the semiconductor layer may comprise one of silicon, silicon germanium and the like. The buried insulating material layer may comprise an insulating material, e.g., silicon oxide or silicon nitride. The base substrate may be a material that may be used as a substrate in the art, e.g., silicon, silicon germanium and the like. The person skilled in the art will appreciate that, in accordance with FDSOI substrates, the semiconductor layer may have a thickness of 30 nm or less, e.g., about 20 nm or less (e.g., in a range from about 10-20 nm), while the buried insulating material layer may have a thickness of about 145 nm or, in accordance with advanced techniques, the buried insulating material layer may have a thickness in a range from about 10-30 nm. For example, in some illustrative embodiments of the present disclosure, the semiconductor layer may have a desired thickness, or target thickness, in a range from about 2-10 nm.

With regard to FIGS. 2a-2e, some illustrative embodiments of a process of manufacturing a semiconductor wafer having a semiconductor-on-insulator (SOI) configuration will be described in greater detail. The schematic illustration in FIGS. 2a-2e is not to scale and is only presented for the sake of describing some illustrative embodiments of the present disclosure in a non-limiting way.

Figure 2A:
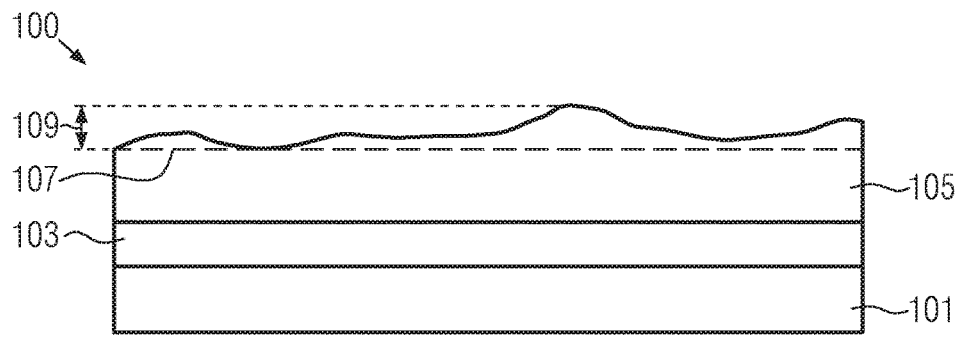
FIGS. 2a-2e schematically illustrate a process of manufacturing an SOI semiconductor starting wafer in accordance with some illustrative embodiments of the present disclosure.

FIG. 2a schematically illustrates a semiconductor starting wafer 100 that may be provided at the beginning of wafer processing, e.g., prior to the formation of gate structures during front-end-of-line (FEOL) processing. In accordance with illustrative embodiments of the present disclosure, the provided semiconductor starting wafer 100 has a base substrate 101, a buried insulating material layer 103, and a semiconductor layer 105 disposed on each other, wherein the buried insulating material layer 103 is interposed or sandwiched between the base substrate 101 and the semiconductor layer 105. As indicated in the cross-sectional view of FIG. 2a, an upper surface of the semiconductor layer 105 has a thickness variability, that is, the thickness of the semiconductor layer 105 varies by the amount as indicated by the double arrow 109 in addition to a minimal thickness t (corresponds in FIG. 2a to a thickness of the semiconductor layer 105 from an interface between 105 and 103 to the broken line 107; in the following the thickness t is accordingly understood) with regard to a broken line 107.

In accordance with some illustrative examples, the double arrow 109 may indicate a variability in the thickness of the semiconductor layer 105, e.g., greater than 1 nm, and may be on the order of several nanometers.

In accordance with some illustrative embodiments of the present disclosure, the base substrate 101 may be a semiconductor base substrate as employed in SOI techniques, such as a silicon base substrate, germanium base substrate and the like. For example, the base substrate 101 may comprise monocrystalline silicon having a plane orientation of (100).

In accordance with some illustrative embodiments of the present disclosure, the semiconductor layer 105 may be, for example, P-type monocrystalline silicon having a plane orientation of (100), a crystal orientation (110) or (100) parallel to an orientation flat or notch.

In accordance with some illustrative embodiments, the semiconductor layer 105 may have an initial thickness of about 30 nm or less, e.g., in the range of about 10-20 nm. The person skilled in the art will appreciate that, in according illustrative embodiments, the starting wafer 100 may have an FDSOI configuration.

In accordance with some illustrative embodiments of the present disclosure, the buried insulating material layer 103 may be formed of a silicon oxide film having a thickness of 10 nm or less. This does not pose any limitation to the present disclosure and the buried insulating material layer 103 may be formed by silicon nitride instead.

Figure 2B:
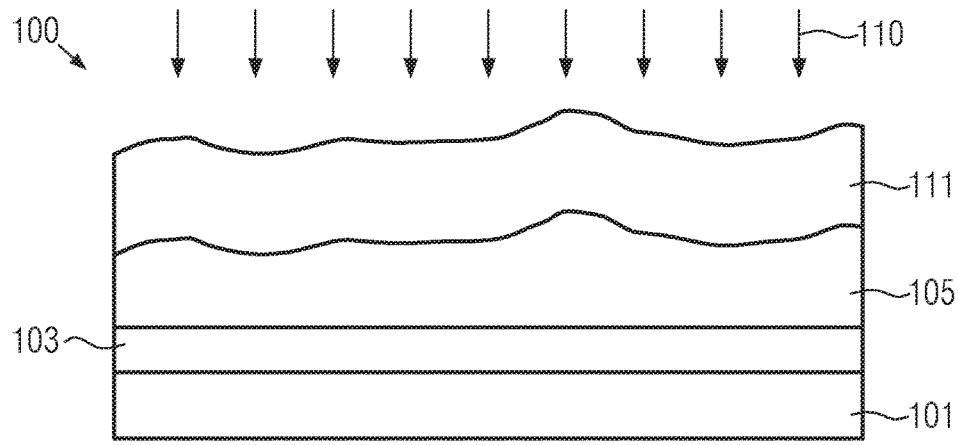

FIG. 2b schematically illustrates the semiconductor starting wafer 100 at a more advanced stage during processing, when an oxidization process 110 is performed and an oxide surface region 111 is formed on the semiconductor layer 105 by oxidizing an upper surface region of the semiconductor layer 105. In accordance with some illustrative examples of the present disclosure, the oxidization process 110 may comprise exposing the semiconductor starting wafer 100 to the oxidization process 110 in a furnace for thermally treating semiconductor wafers such that a thermal oxidization may be performed, or by performing a rapid thermal oxidization process. In still some other alternatives, the oxidization process 110 may include an oxidization process at low temperatures, such as plasma oxidization. However, this does not pose any limitation to the present disclosure.

In accordance with some illustrative embodiments of the present disclosure, the oxide surface region 111 may have a thickness in a range from about 2-10 nm, e.g., the oxide surface region 111 may have a thickness in a range from about 2-7 nm or in a range from about 2-5 nm or in a range from about 4-9 nm or in a range from about 4-7 nm.

In accordance with some illustrative embodiments of the present disclosure, the oxidization process 110 may be adjusted to oxidize the semiconductor layer 105 such that an amount of 5-20% of the thickness t of the semiconductor layer 105 is oxidized. For example, an amount of 10-20% of the thickness t of the semiconductor layer 105 may be oxidized.

Figure 2C:
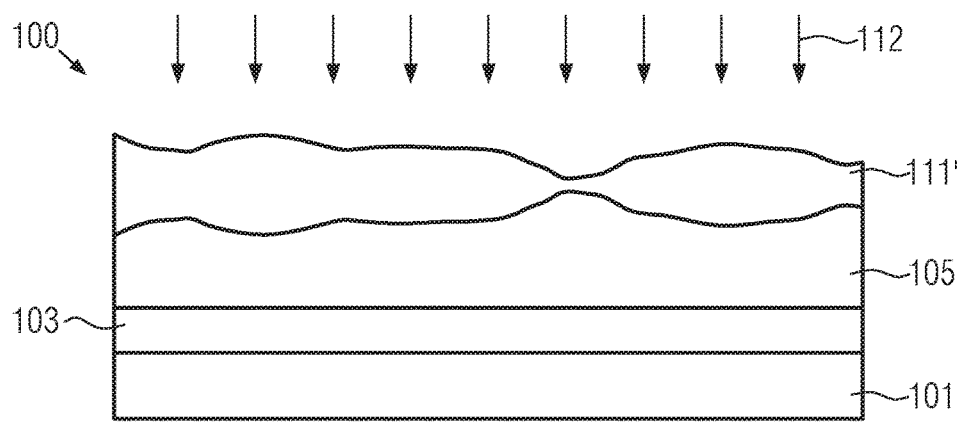

FIG. 2c schematically illustrates the semiconductor starting wafer 100 at a more advanced stage during processing, at which a thinning of the oxide surface region 111 in FIG. 2b is performed, resulting in a thinned oxide surface region 111'.

In accordance with some illustrative embodiments of the present disclosure, the thinning of the oxide surface region 111 in FIG. 2b may comprise an ion beam induced etching 112 of the oxide surface region 111 in FIG. 2b. In accordance with some illustrative examples herein, the ion beam induced etching 112 may comprise scanning an ion beam over the semiconductor starting wafer 100 in a halocarbon environment. The person skilled in the art will appreciate that, during scanning of an ion beam over the semiconductor starting wafer 100, an intensity of the scanning ion beam may be varied for locally thinning the oxide surface region 111 in a desired manner. In accordance with some special illustrative examples herein, the ion beam induced etching 112 may be configured to locally etch the oxide surface region 111 in a way such that a greater amount of material of the oxide surface region 111 is removed at positions on the surface of the semiconductor starting wafer 100 having a thicker semiconductor layer 105 and showing a greater variation 109 with respect to the broken line 107 in FIG. 2a.

In accordance with some illustrative alternative embodiments of the present disclosure, the thinning of the oxide surface region 111 in FIG. 2b may comprise a local laser etching 112 of the oxide surface region 111 in FIG. 2b. In accordance with some illustrative examples herein, the local laser etching 112 may comprise scanning a laser beam, e.g., a focused laser beam, over the semiconductor starting wafer 100 in a halocarbon environment. The person skilled in the art will appreciate that, during scanning of a laser beam over the semiconductor starting wafer 100, an intensity of the scanning laser beam may be varied for locally thinning the oxide surface region 111 in a desired manner. In accordance with some special illustrative examples herein, the local laser etching 112 may be configured to locally etch the oxide surface region 111 in a way such that a greater amount of material of the oxide surface region 111 is removed at positions on the surface of the semiconductor starting wafer 100 having a thicker semiconductor layer 105 and showing a greater variation 109 with respect to the broken line 107 in FIG. 2a.

Figure 2D:
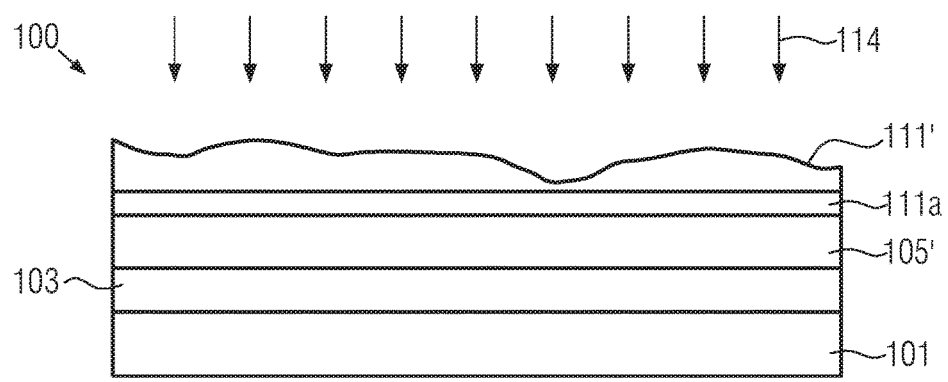

FIG. 2d schematically illustrates the semiconductor starting wafer 100 at a more advanced stage during fabrication, particularly when the semiconductor starting wafer 100 is exposed to an oxidization process 114. The oxidization process 114 is configured such that the thinned oxide surface region 111' is increased by the oxidization process 114 into the semiconductor layer 105 by forming a further oxide region 111a and decreasing a thickness of the semiconductor layer 105 such that a semiconductor layer 105' of a decreased thickness relative to the semiconductor layer 105 in FIG. 2a is obtained.

In accordance with some illustrative embodiments of the present disclosure, during the oxidization process 114, a thickness of the resulting oxide surface region (which is formed by the thinned oxide surface region 111' and the further oxide region 111a) is locally increased in that a thickness of the thinned oxide surface region 111' is locally increased in dependence on a thickness of the thinned oxide surface region 111'. For example, the oxide surface region 111' grows locally faster or slower in dependence on the local thickness of the oxide surface region 111'. That is, with smaller thickness, the oxide surface region 111' grows faster and, with greater thickness, the oxide surface region 111' grows slower. The person skilled in the art will appreciate that a depth of the oxide surface region 111', 111a reaching into the semiconductor layer 105' becomes more even when compared to the variability of the thickness of the semiconductor layer 105 as denoted by double arrow 109 in FIG. 2a. In other words, the semiconductor layer 105' has a more uniform thickness when compared with the semiconductor layer 105 in FIG. 2a.

In accordance with some illustrative examples of the present disclosure, a variability of the semiconductor layer 105' relative to the variability of the thickness of the semiconductor layer 105 (as indicated by double arrow 109 in FIG. 2a) is reduced by at least 50%, e.g., by at least 70%.

In accordance with some illustrative embodiments of the present disclosure, the oxidization process 114 may comprise a thermal oxidization using a furnace or a rapid thermal oxidation process. Alternatively, without limitation, an oxidization process at low temperatures may be performed, such as plasma oxidation.

After a complete reading of the present disclosure, the person skilled in the art will appreciate that the boundary line separating the further oxide surface region 111a and the semiconductor layer 105' may not be as smooth as the illustration in FIG. 2d shows. The illustration in FIG. 2d is only schematic and not limiting in this regard. The person skilled in the art will appreciate that the semiconductor layer 105' may have a varying thickness, however, the variability of the thickness of the semiconductor layer 105' being small as compared to the variability as illustrated by reference numeral 109 in FIG. 2a, particularly, the semiconductor layer 105' may have a thickness complying with any required uniformity.

Figure 2E:
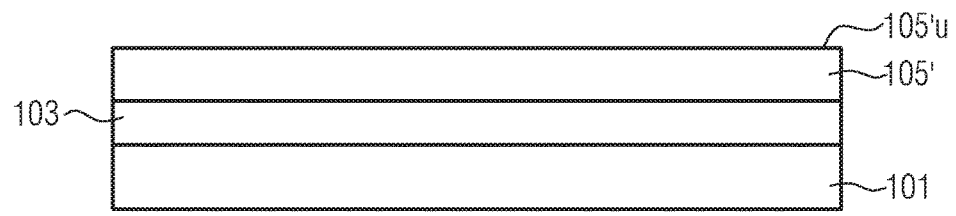

FIG. 2e schematically illustrates the semiconductor starting wafer 100 at a more advanced stage during fabrication, after the oxide surface region 111', 111a is removed and the semiconductor layer 105' is exposed, particularly, an upper surface 105'$u$ of the semiconductor layer 105' is exposed.

In accordance with some illustrative embodiments of the present disclosure, the oxide surface region 111', 111$a$ may be removed by an etching process (not illustrated), using DHF or CERTAS.

In accordance with some illustrative embodiments of the present disclosure, the oxidization process 110 in FIG. 2$b$, the thinning process 112 as illustrated in FIG. 2$c$, and the oxidization process 114 as illustrated in FIG. 2$d$ may be configured such that a target thickness of the semiconductor layer 105' may be reached. The target thickness of the semiconductor layer 105' may be set to at most about 30 nm.

In accordance with some illustrative embodiments, the target thickness may be set in the range from about 1-10 nm, such as in a range from about 5-10 nm (e.g., at about 6 nm), when processing a starting wafer being provided in accordance with FDSOI technologies. This does not pose any limitation to the present disclosure and the person skilled in the art will appreciate that, upon selecting an appropriate target thickness, semiconductor starting wafers 100 in accordance with other SOI technologies may be provided, e.g., PDSOI technologies.

In accordance with some illustrative embodiments of the present disclosure, a thickness profile of the semiconductor starting wafer 100 at the stage as illustrated in FIG. 2$e$ may be performed.

In accordance with some illustrative embodiments of the present disclosure, based on the determined thickness profile of the semiconductor starting wafer 100 as illustrated in FIG. 2$e$, the process as described above with regard to FIGS. 2$a$-2$e$ may be repeated in case that a desired thickness profile is not reached to a desired degree of accuracy. The person skilled in the art will appreciate, after a complete reading of the present disclosure, that the process as illustrated with regard to FIGS. 2$a$-2$d$ may be an iterative process, e.g., may be repeated at least one time for obtaining a desired thickness profile of the semiconductor layer 105'.

In accordance with some illustrative embodiments of the present disclosure, the semiconductor starting wafer 100 may be subjected to FEOL processing for forming semiconductor devices, e.g., transistor devices and the like, in the semiconductor layer 105' and on the semiconductor layer 105'.

In accordance with some illustrative embodiments of the present disclosure, a thickness profile of the semiconductor starting wafer 100 may be obtained by performing an ellipsometer thickness measurement. Herein, a fit between measurement points may be performed in accordance with known fitting procedures in accordance with known curve fitting methods in order to obtain best or optimized fits to a series of data points.

With regard to ellipsometer thickness measurements, the person skilled in the art will appreciate that ellipsometry is an optical technique for investigating the dielectric properties (complex, refractive, index or dielectric function) of thin films by measuring the change of polarization upon reflection or transmission of incident radiation in a known polarization state interacting with a material structure of interest (reflective, absorbed, scattered, transmitted) and measuring the change in the polarization of the incident radiation to the interacted radiation. As the measurement signal obtained in ellipsometry depends on the thickness of the material structure of interest, among other material properties, ellipsometry represents a contact-free determination of the thickness of a material structure of interest. For example, an ellipsometry experiment may be set up by a light source emitting a radiation of a predefined state (e.g., radiation prepared in a known state by a polarizer, commentator and the like), and a detector for detecting light reflected by a sample, the detector being configured to detect the change in the state of the incident radiation on the sample. After data acquisition and computation of the data in accordance with known evaluation methods, the acquired data is analyzed and the thickness of layers of the sample may be obtained. Accordingly, a thickness profile of the oxide surface region 111 and the semiconductor layer 105 in FIG. 2$a$, as well as a thickness profile of the semiconductor layer 105' in FIG. 2$e$, may be obtained.

Figure 3:
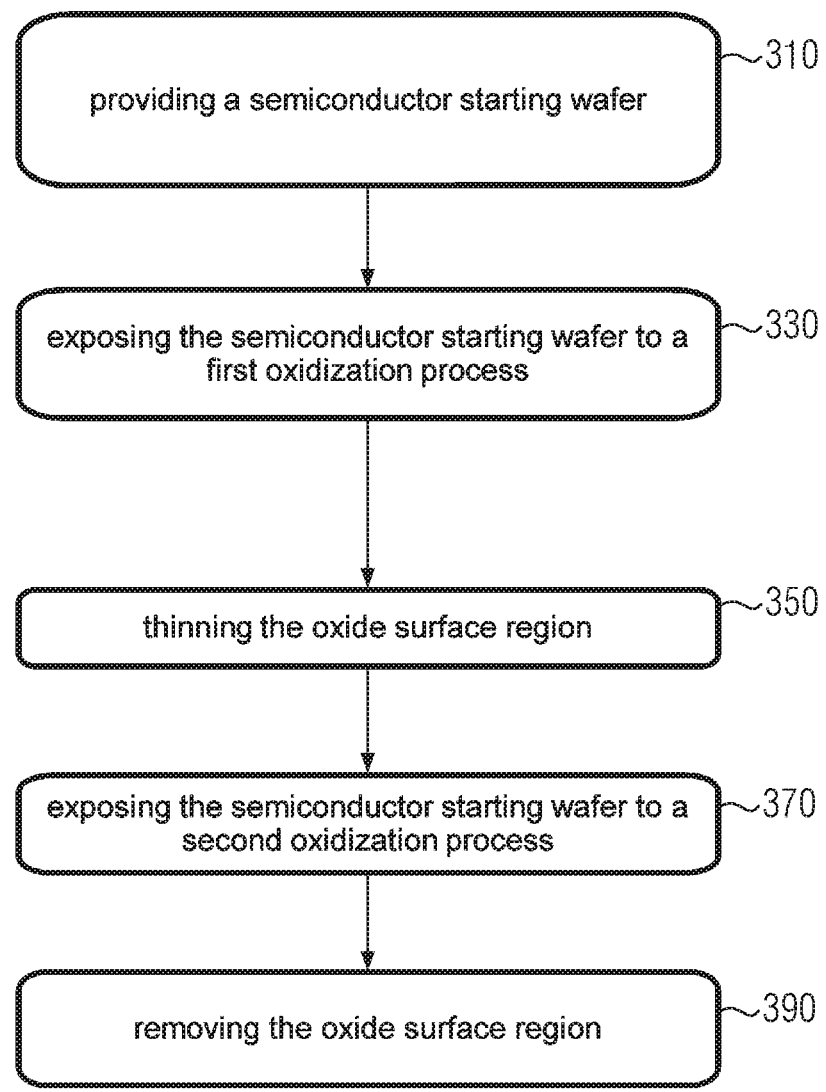
FIG. 3 schematically illustrates a flow diagram of a method in accordance with some illustrative embodiments of the present disclosure.

With regard to FIG. 3, an illustrative process flow of a method of manufacturing a semiconductor wafer having a semiconductor-on-insulator (SOI) configuration in accordance with some illustrative embodiments of the present disclosure will be described.

In accordance with some illustrative embodiments of the present disclosure, a semiconductor starting wafer may be provided at step 310. The semiconductor starting wafer may be configured as discussed above with regard to FIG. 2$a$, the semiconductor starting wafer having an SOI configuration and, thus, comprising a base substrate, a semiconductor layer, and a buried insulating material layer interposed between the base substrate and the semiconductor layer.

At step 330, the semiconductor starting wafer may be exposed to a first oxidization process, wherein an oxide surface region may be formed by oxidizing an upper surface region of the semiconductor layer. In accordance with some explicit examples, the first oxidization process may correspond to the oxidization process 110 as described above and the oxide surface region may correspond to the oxide surface region 111 as described above.

At step 350, the oxide surface region may be thinned, e.g., in a dry etching process. In accordance with some illustrative examples herein, the thinning of the oxide surface region may be performed in accordance with the explanations given above with regard to FIG. 2$c$.

At step 370, the semiconductor starting wafer may be exposed to a second oxidization process, wherein a thickness of the oxide surface region is locally increased. In accordance with some illustrative examples herein, the second oxidization process may correspond to the oxidization process 112 as described above with regard to FIG. 2$d$.

At step 390, the oxide surface region may be removed, e.g., in a wet etching process, wherein the semiconductor layer having a preset target thickness is exposed. In accordance with some illustrative examples herein, the removal of the oxide surface region may be performed by using an agent for etching an oxide material, e.g., DHF or CERTAS.

Figure 4:
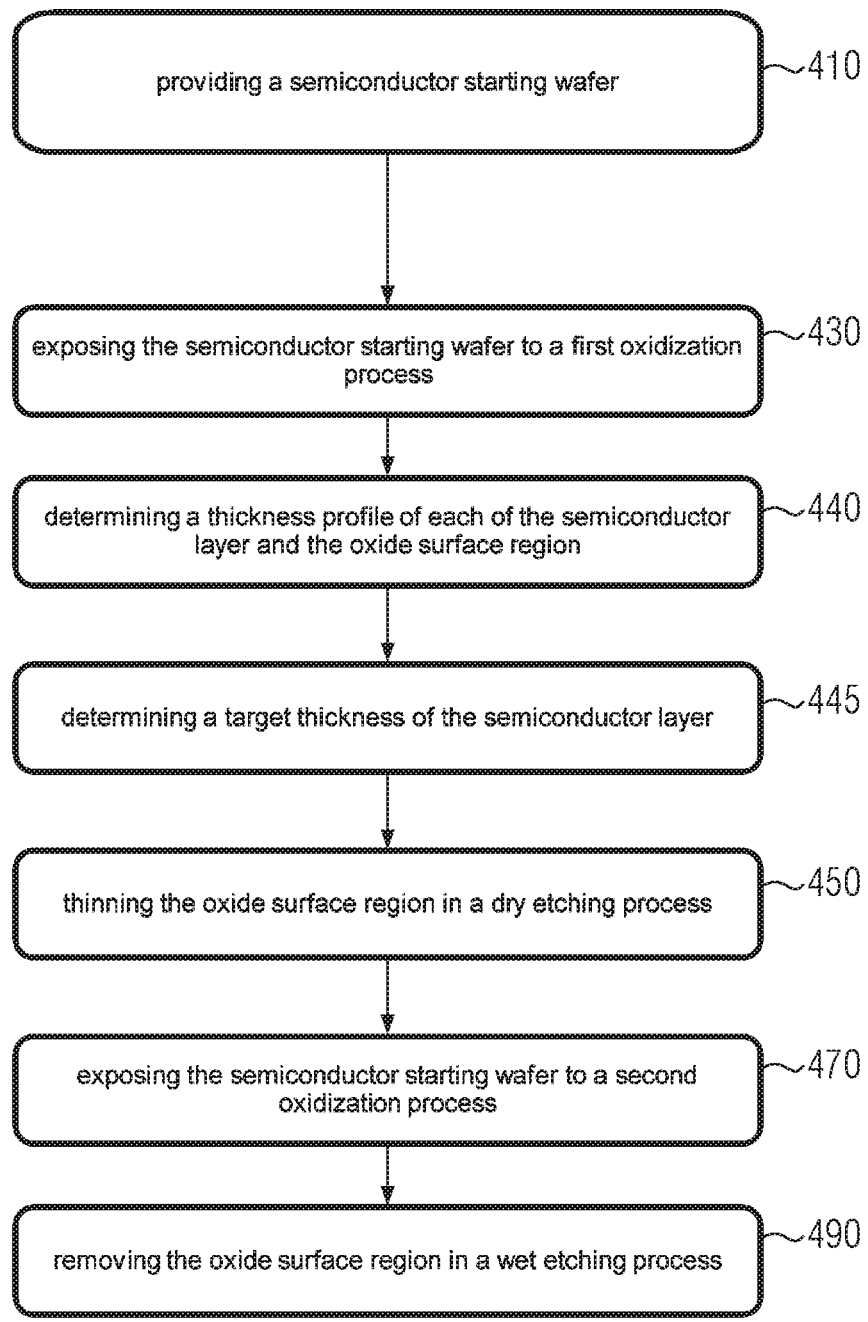
FIG. 4 schematically illustrates a flow diagram of a method in accordance with other illustrative embodiments of the present disclosure.

With regard to FIG. 4, an illustrative process flow of a method of manufacturing a semiconductor wafer having a semiconductor-on-insulator (SOI) configuration in accordance with some illustrative embodiments of the present disclosure will be described.

In accordance with some illustrative embodiments of the present disclosure, a semiconductor starting wafer may be provided at step 410. The semiconductor starting wafer may be configured as discussed above with regard to FIG. 2$a$, the semiconductor starting wafer having an SOI configuration and, thus, comprising a base substrate, a semiconductor layer, and a buried insulating material layer interposed between the base substrate and the semiconductor layer.

At step 430, the semiconductor starting wafer may be exposed to a first oxidization process, wherein an oxide surface region may be formed by oxidizing an upper surface region of the semiconductor layer. In accordance with some explicit examples, the first oxidization process may correspond to the oxidization process 110 as described above and the oxide surface region may correspond to the oxide surface region 111 as described above.

At step 440, a thickness profile of each of the semiconductor layer and the oxide surface region may be determined. In accordance with some illustrative embodiments herein, the thickness profile may be determined in accordance with ellipsometry measurements as explained above.

At step 445, a target thickness of the semiconductor layer may be determined. In accordance with some special illustrative examples herein, the target thickness may be determined on the basis of data relating to the thickness profiles of the semiconductor layer and the oxide surface region and/or data relating to at least one process performed during the processing of the semiconductor starting wafer, e.g., the first oxidization process, and at least one subsequent process to be described below. For example, the data may be based on feedforward modeling.

At step 450, the oxide surface region may be thinned in a dry etching process. In accordance with some illustrative examples herein, the thinning of the oxide surface region may be performed in accordance with the explanations given above with regard to FIG. 2c.

At step 470, the semiconductor starting wafer may be exposed to a second oxidization process, wherein a thickness of the oxide surface region is locally increased. In accordance with some illustrative examples herein, the second oxidization process may correspond to the oxidization process 112 as described above with regard to FIG. 2d.

At step 490, the oxide surface region may be removed in a wet etching process, wherein the semiconductor layer having the target thickness is exposed. In accordance with some illustrative examples herein, the removal of the oxide surface region may be performed by using an agent for etching an oxide material, e.g., DHF or CERTAS.

After a complete reading of the present disclosure, the person skilled in the art will appreciate that a material quantity of the oxide surface region removed during the dry etch process as described above with regard to step 350 and/or 450, or the thinning process as described above with regard to FIG. 2c, may depend on a local thickness of the semiconductor layer such that the removed material quantity of the oxide surface region increases with increasing local thickness of the semiconductor layer and decreases with decreasing local thickness of the semiconductor layer. Accordingly, the process for removing a material quantity of the oxide surface region during a thinning process of the oxide surface region may be controlled such that the removed material quantity locally correlates with a thickness of the semiconductor layer.

After a complete reading of the present disclosure, the person skilled in the art will appreciate that the oxide surface region may be locally increased during the second oxidization process as described with regard to step 370 and/or 470 above, or as described with regard to FIG. 2d above, such that a uniformity of the thickness of the semiconductor layer is increased.

After a complete reading of the present disclosure, the person skilled in the art will appreciate that the second oxidization process as described above with regard to step 370 and/or 470, or the oxidization process 114 as described with regard to FIG. 2d above, may comprise an endpoint determination provided by feedforward model data or pre-calculated time data. For example, the endpoint determination may depend on the target thickness as described above with regard to step 445.

After a complete reading of the present disclosure, the person skilled in the art will appreciate that at least some illustrative embodiments of the present disclosure as described above show a planarization of a semiconductor layer of a semiconductor starting wafer provided with an SOI configuration, where an upper surface of the semiconductor layer is oxidized such that an oxide is formed on the semiconductor layer, the oxide is locally thinned depending on a thickness profile of the semiconductor layer, and a further oxidization is performed prior to removing the oxide. Accordingly, semiconductor starting wafers having a semiconductor layer of a variability complying with advanced requirements on the variability as imposed by very large scale integration techniques and beyond may be obtained.

After a complete reading of the present disclosure, the person skilled in the art will appreciate that the semiconductor starting wafer as manufactured in accordance with at least some illustrative embodiments of the present disclosure may comply with any uniformity requirements on a thickness of the semiconductor layer of the manufactured starting wafer, e.g., by appropriately adjusting and tuning at least one process performed during the manufacturing, e.g., at least one of first oxidization processes, second oxidization processes, thinning processes, etching processes, and the like.

After a complete reading of the present disclosure, the person skilled in the art will appreciate that, in FDSOI technologies, starting wafers may be manufactured, the starting wafers having semiconductor layers (i.e., top semiconductor layers) with a deviation from a target thickness, e.g., an illustrative target thickness of less than about 10 nm (such as in a range from about 5-10 nm, e.g., at about 6 nm), being in a range of 1 angstroms (0.1 nm) or low single digit angstroms (e.g., around about 5 angstroms). In accordance with some illustrative examples, a thickness of an oxide surface region formed in a first oxidation process may vary locally between 2-10 nm.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of manufacturing a semiconductor wafer having a semiconductor-on-insulator (SOI) configuration, comprising:

providing a semiconductor starting wafer, said semiconductor starting wafer having a base substrate, a semiconductor layer formed over said base substrate, and a buried insulating material layer formed between said semiconductor layer and said base substrate;

exposing said semiconductor starting wafer to a first oxidization process, wherein an oxide surface region is formed by oxidizing an upper surface region of said semiconductor layer over an entirety of said semiconductor starting wafer;
thinning said oxide surface region over said entirety of said semiconductor starting wafer;
exposing said semiconductor starting wafer to a second oxidization process, wherein a thickness of said oxide surface region is locally increased; and
after exposing said semiconductor starting wafer to said second oxidation process, completely removing said oxide surface region over said entirety of said semiconductor starting wafer, wherein an entirety of said semiconductor layer is exposed.

2. The method of claim 1, wherein a material quantity of said oxide surface region removed during said thinning depends on a local thickness of said semiconductor layer such that said removed material quantity increases with increasing local thickness and decreases with decreasing local thickness.

3. The method of claim 1, wherein said thickness of said oxide surface region is locally increased during said second oxidization process such that a uniformity of said thickness of said semiconductor layer is increased.

4. The method of claim 1, wherein said thinning of said oxide surface region comprises one of an ion beam induced etching and a local laser etching of said oxide surface region, said ion beam induced etching comprising scanning an ion beam over said semiconductor starting wafer, and said local laser etching comprising scanning a focused laser beam over said semiconductor starting wafer.

5. The method of claim 1, wherein a thickness of said oxide surface region formed in said first oxidation process varies locally between 2-10 nm.

6. The method of claim 1, wherein an initial thickness of said semiconductor layer when providing said semiconductor starting wafer locally lies within a range between 10-20 nm.

7. The method of claim 1, wherein at least one of said first and second oxidization processes comprises one of a thermal oxidization and a plasma oxidization.

8. The method of claim 7, wherein said thermal oxidization comprises one of a furnace oxidization and a rapid thermal oxidization.

9. The method of claim 1, wherein said second oxidization process comprises an endpoint determination provided by one of feedforward model data and pre-calculated time data.

10. A method of manufacturing a semiconductor wafer having a semiconductor-on-insulator (SOI) configuration, comprising:
providing a semiconductor starting wafer, said semiconductor starting wafer having a base substrate, a semiconductor layer formed over said base substrate, and a buried insulating material layer formed between said semiconductor layer and said base substrate;
exposing said semiconductor starting wafer to a first oxidization process, wherein an oxide surface region is formed by oxidizing an upper surface region of said semiconductor layer;
determining a thickness profile of each of said semiconductor layer and said oxide surface region;
determining a target thickness of said semiconductor layer;
thinning said oxide surface region by performing a dry etching process;
exposing said semiconductor starting wafer to a second oxidization process, wherein a thickness of said oxide surface region is locally increased; and
removing said oxide surface region by performing a wet etching process, wherein said semiconductor layer having said target thickness is exposed.

11. The method of claim 10, wherein determining said target thickness comprises determining said target thickness based on data relating to said thickness profiles of said semiconductor layer and said oxide surface region, said dry etching process, said second oxidization process, and said wet etching process.

12. The method of claim 10, wherein a material quantity of said oxide surface region removed during said dry etch process depends on a local thickness of said semiconductor layer such that said removed material quantity increases with increasing local thickness and decreases with decreasing local thickness.

13. The method of claim 10, wherein said thickness of said oxide surface region is locally increased during said second oxidization process such that a uniformity of said thickness of said semiconductor layer is increased.

14. The method of claim 10, wherein performing said dry etch process comprises performing a local laser etching of said oxide surface region, comprising scanning a focused laser beam over said semiconductor starting wafer.

15. The method of claim 10, wherein performing said dry etch process comprises performing an ion beam induced etching of said oxide surface region, comprising scanning an ion beam over said semiconductor starting wafer.

16. The method of claim 10, wherein a thickness of said oxide surface region formed in said first oxidation process varies locally between 2-10 nm.

17. The method of claim 10, wherein an initial thickness of said semiconductor layer when providing said semiconductor starting wafer lies within a range between 10-20 nm.

18. The method of claim 10, wherein at least one of said first and second oxidization processes comprises one of a thermal oxidization and a plasma oxidization.

19. The method of claim 18, wherein said thermal oxidization comprises one of a furnace oxidization and a rapid thermal oxidization.

20. A method of manufacturing a semiconductor wafer having a semiconductor-on-insulator (SOI) configuration, comprising:
providing a semiconductor starting wafer, said semiconductor starting wafer having a base substrate, a semiconductor layer formed over said base substrate, and a buried insulating material layer formed between said semiconductor layer and said base substrate;
exposing said semiconductor starting wafer to a first oxidization process, wherein an oxide surface region is formed by oxidizing an upper surface region of said semiconductor layer;
thinning said oxide surface region, wherein thinning said oxide surface region comprises performing one of a local laser etching and an ion beam induced etching of said oxide surface region, said local laser etching comprising scanning a focused laser beam over said semiconductor starting wafer, and said ion beam induced etching comprising scanning an ion beam over said semiconductor starting wafer;
exposing said semiconductor starting wafer to a second oxidization process, wherein a thickness of said oxide surface region is locally increased; and
removing said oxide surface region, wherein said semiconductor layer is exposed.

* * * * *